(12) United States Patent
Hirose et al.

(10) Patent No.: US 7,915,582 B2
(45) Date of Patent: Mar. 29, 2011

(54) METHOD FOR ESTIMATION OF PROBE SHAPE IN CHARGED PARTICLE BEAM INSTRUMENTS

(75) Inventors: Kotoko Hirose, Abiko (JP); Takeshi Kawasaki, Musashino (JP); Haruo Yoda, Hinode (JP); Tomonori Nakano, Kokubunji (JP)

(73) Assignee: Hitachi High-Technologies Corporation, Tokyo (JP)

( * ) Notice: Subject to any disclaimer, the term of this patent is extended or adjusted under 35 U.S.C. 154(b) by 738 days.

(21) Appl. No.: 11/958,698

(22) Filed: Dec. 18, 2007

(65) Prior Publication Data
US 2010/0264309 A1    Oct. 21, 2010

(30) Foreign Application Priority Data

Dec. 21, 2006   (JP) ................................ 2006-343701

(51) Int. Cl.
*H01J 37/26* (2006.01)
(52) U.S. Cl. ........................ 250/310; 250/306; 250/307
(58) Field of Classification Search ................ 250/306, 250/307, 309, 310, 311; 850/5, 8, 9, 10, 850/11
See application file for complete search history.

(56) References Cited

U.S. PATENT DOCUMENTS

| 6,670,611 | B1 * | 12/2003 | Kruit et al. ........................ 850/9 |
| 6,858,844 | B2 | 2/2005 | Zach |
| 7,060,986 | B2 | 6/2006 | Nakamura |
| 7,095,031 | B2 | 8/2006 | Uno |
| 2004/0174588 | A1 * | 9/2004 | Iwaki et al. .................... 359/368 |
| 2005/0189496 | A1 * | 9/2005 | Uno .......................... 250/396 R |
| 2005/0247860 | A1 * | 11/2005 | Shishido et al. .............. 250/210 |

* cited by examiner

*Primary Examiner* — Robert Kim
*Assistant Examiner* — Nicole Ippolito Rausch
(74) *Attorney, Agent, or Firm* — Mattingly & Malur, P.C.

(57) ABSTRACT

A method for estimation of a probe shape, in a scanning electron microscope provided with an aberration corrector, and the method is designed so as to obtain a probe image, by inputting to a computer an image taken in a just-focused state and an image taken in a de-focused state, as an image data; preparing a correlation window by automatically determining a size of a correlation window image, based on an input data size and an output data size; executing cross-correlation calculation between the correlation window and a reference area; and repeating this calculation while shifting the reference area, so as to obtain a cross-correlation matrix, in order to stably obtain the probe image, without receiving effects of use conditions or noises.

12 Claims, 8 Drawing Sheets

| | THE PRESENT INVENTION | CONVENTIONAL METHOD |
|---|---|---|
| UNDER NOISE-FREE CONDITION | | |
| UNDER NOISY CONDITION | | |

METHOD FOR ESTIMATION OF PROBE SHAPE IN CHARGED PARTICLE BEAM INSTRUMENTS

INCORPORATION BY REFERENCE

The present application claims priority from Japanese application JP2006-343701 filed on Dec. 21, 2006, the content of which is hereby incorporated by reference into this application.

BACKGROUND OF THE INVENTION

The present invention relates to a method for automatic focusing, automatic astigmatic matching and automatic adjustment of an aberration corrector, or the like, of a scanning electron microscope, in particular, a scanning electron microscope (SEM) and a scanning transmission electron microscope (STEM).

In an application instrument of a charged particle beam, such as an electron microscope or an ion beam processing instrument or the like, an observed image or a specimen is processed by irradiation of a convergent charged particle beam onto a specimen. Resolution or processing accuracy of these charged particle beam instruments is determined by a size of the convergent charged particle beam (probe), and in principle, smaller size of the probe (probe diameter) is capable of enhancing resolution or processing accuracy. Recently, development of an aberration corrector for application instruments of the charged particle beam has been promoted, and practical application thereof has been progressed. In the aberration corrector, inverse aberration is given for a probe beam, by applying a rotationally asymmetric electric field or magnetic field to the probe beam, by using a multipole lens. In this way, various aberrations can be cancelled, such as spherical aberration, chromatic aberration and the like, which generate at an object lens or a deflector lens of a charged particle optical system.

In the charged particle optical system of a conventional application instrument of a charged particle beam, an axis-rotationally symmetric lens has been used, and thus, in principle, the probe diameter was able to be adjusted to the minimal value, by matching an axis of each of the lenses and an axis of aperture diaphragm, and by adjusting focus and an astigmatic point of the objective lens. In addition, in execution of focus adjustment and astigmatic correction, the adjustment was executed by obtaining a probe image under different focus conditions and by selecting the case with the highest sharpness while comparing image sharpness at least in two directions. On the other hand, in the aberration corrector, because generating aberration is cancelled by giving inverse aberration, correct measurement of kind of aberration (aberration components) and amount of each of the aberration components, contained in the probe beam, is required to remove the aberration. Increase in the aberration may be incurred adversely, and effect of the aberration correction cannot be obtained, in the case where estimation thereof and suitable adjustment of the aberration corrector are not executed.

Because the kind and amount of the aberration components are estimated, based on deviation of a cross-sectional shape of the probe beam from complete round, correct measurement of the cross-sectional shape of the probe beam is required in order to measure the aberration components. In U.S. Pat. No. 6,858,844 B2, a method for estimating the shape of the probe beam by using deconvolution has been disclosed. Explanation will be given below briefly on this method.

Specimen images are taken in a just-focus (a state where the beam is converged onto the specimen), in an under-focus (a state where the beam is converged at the backward of the specimen), and in an over-focus (a state where the beam is converged at the frontward of the specimen), and then each of the images is subjected to Fourier transformation. The Fourier transformation of under-focused image is divided with the Fourier transformation of in-focused image to obtain a quotient. The above process can be expressed by convolution integral (convolution) like the following equation (1), by using $h(x, y)$ as a SEM image, $f(x, y)$ as intensity information of secondary electrons, reflection electrons and the like, which generates from the specimen (including information on surface property or substances of the specimen), and $g(x, y)$ as probe intensity information:

$$h(x,y) = \iint f(u,v) g(x-u, y-v) du dv \quad \text{(Equation 1)}$$

Expression thereof in Fourier space gives:

$$H(X,Y) = F(X,Y) G(X,Y) \quad \text{(Equation 2)}$$

where the equation, is held, and F and G are also those obtained by Fourier transformation of corresponding amounts.

The equation (2) is held for any of the amount for the just-focused image and the under- or over-focused image (de-focused images), and $H0=FG0$, and $H1=FG1$ are held, when expressed by using the additional subscript character 0 and additional subscript character 1, respectively. Because the intensity information of probe in the under- or over-focused state cancels specimen information, it is divided to provide the equation (3).

$$G_1 = G_o (H_1 / H_o) \quad \text{(Equation 3)}$$

G1 can be determined by assuming ideal Gaussian distribution or the like as the probe intensity distribution G0, and the probe intensity g1 in the de-focused state can be determined by inverse Fourier transformation of G1.

Similarly, in U.S. Pat. No. 7,095,031 B2, and U.S. Pat. No. 7,060,986 B2, a method for estimating a probe shape, by using the above-explained FFT deconvolution, has been disclosed.

SUMMARY OF THE INVENTION

In a conventional method (hereafter written as a deconvolution method) to determine the probe shape in the over- or under-focus (hereafter generally written as de-focus), division of the Fourier transformation of an image data is certainly executed to extract only probe information, by separating specimen information and probe information. Execution of this division surely requires use of any kind of a frequency filter to avoid divergence caused by zero division at a higher space frequency side. Namely, the probe shape in the de-focused state obtained by the deconvolution method, varies depending on what kind of the filter is used.

Furthermore, the deconvolution method had a problem that the probe shape finally obtained is incorrect, in such a way that in the case where an image data with low S/N ratio is used, contour of the probe shape becomes unclear or artifact may be commingled, by noises contained in the image data.

Accordingly, it is an object of the present invention to attain a method for estimating the probe beam shape more correctly as compared with a conventional method, or instruments therefor, in probe beam instruments which realize various functions, by using an image data or a signal data obtained by irradiation of the probe beam for the specimen.

In the present invention, a cross-sectional shape of the probe beam in the de-focused state is obtained, by executing cross-correlation calculation by using the distribution data of pixels obtained in the just-focused state and the distribution data of pixels obtained in the de-focused state, and by determining a cross-correlation matrix of two distribution data sets. Explanation will be given below on acquiring principle thereof, by using equations.

The cross-correlation i(x, y) between the 2-dimensional distribution data of pixels in the just-focused state and the 2-dimensional distribution data of pixels d in the de-focused state is defined by the following equation (4)

$$i(x,y)=\iint h_o(u,v)h_1(u+x,v+y)dudv \quad \text{(Equation 4)}$$

The equation (4) is represented as follows in Fourier space.

$$I(X, Y) = H_o*(X, Y)H_1(X, Y)$$
$$= F*G_0*FG_1$$
$$= F*FG_0*G_1.$$

Here, in the case where the specimen has a random structure over wide space frequency band, $F^*F\approx 1$ is held (a self correlation function of a data assembly having a random structure is approximated by a delta function), and the above $F^*FG0^*G1$ is represented as follows:

$$=G_0*G_1 \quad \text{(Equation 5)}$$

where by assuming g0 to be the delta function, and inverse Fourier transforming the equation (5) to a real space function, the correlation function is given as follows:

$$i(x,y)=g_1(x,y) \quad \text{(Equation 6)}$$

and it is understood that the left side of the equation (6) may be considered probe intensity distribution g1(x, y) under the de-focused condition.

As explained above, under the restriction that the specimen has a random structure, the probe shape in the de-focused state can be known by determination of the cross-correlation n between the just-focused image and the de-focused image.

In addition here, by adjusting focus deviation and image magnification, so that ratio between a pixel number composing a probe shape image in the just-focused state, and a pixel number composing a probe shape image in the de-focused state is roughly about 1:10 to 1:100 (a pixel number composing the probe shape image in the just-focused state of several pixels, and a pixel number composing the probe shape image in the de-focused state of from about several tens to hundred pixels), accuracy of the delta function approximation in the equation (5) (g0 represents the delta function, and G0* represents constant) is improved, and also correctness of the probe shape obtained is improved.

The present invention does not require filter processing operation because of not having a process of zero division in frequency space. Therefore, the present invention can provide the objective probe shape in more stably, as compared with the deconvolution method having instability of zero division. Furthermore, the present invention is suitable to automation.

Other objects, features and advantages of the invention will become apparent from the following description of the embodiments of the invention taken in conjunction with the accompanying drawings.

DETAILED DESCRIPTION OF THE INVENTION

Embodiment 1

In the present embodiment, explanation will be given on an application example to a scanning electron microscope (SEM) that is capable of providing various functions such as length measurement, specimen inspection and the like. It should be noted that in the following explanation, "the just-focused state" means a state that the charged particle beam is converged onto a specimen surface, and "the de-focused state" means a state that the charged particle beam is not converged onto a specimen surface but is converged at the front or a far-side of the specimen surface at a light axis.

Figure 1:
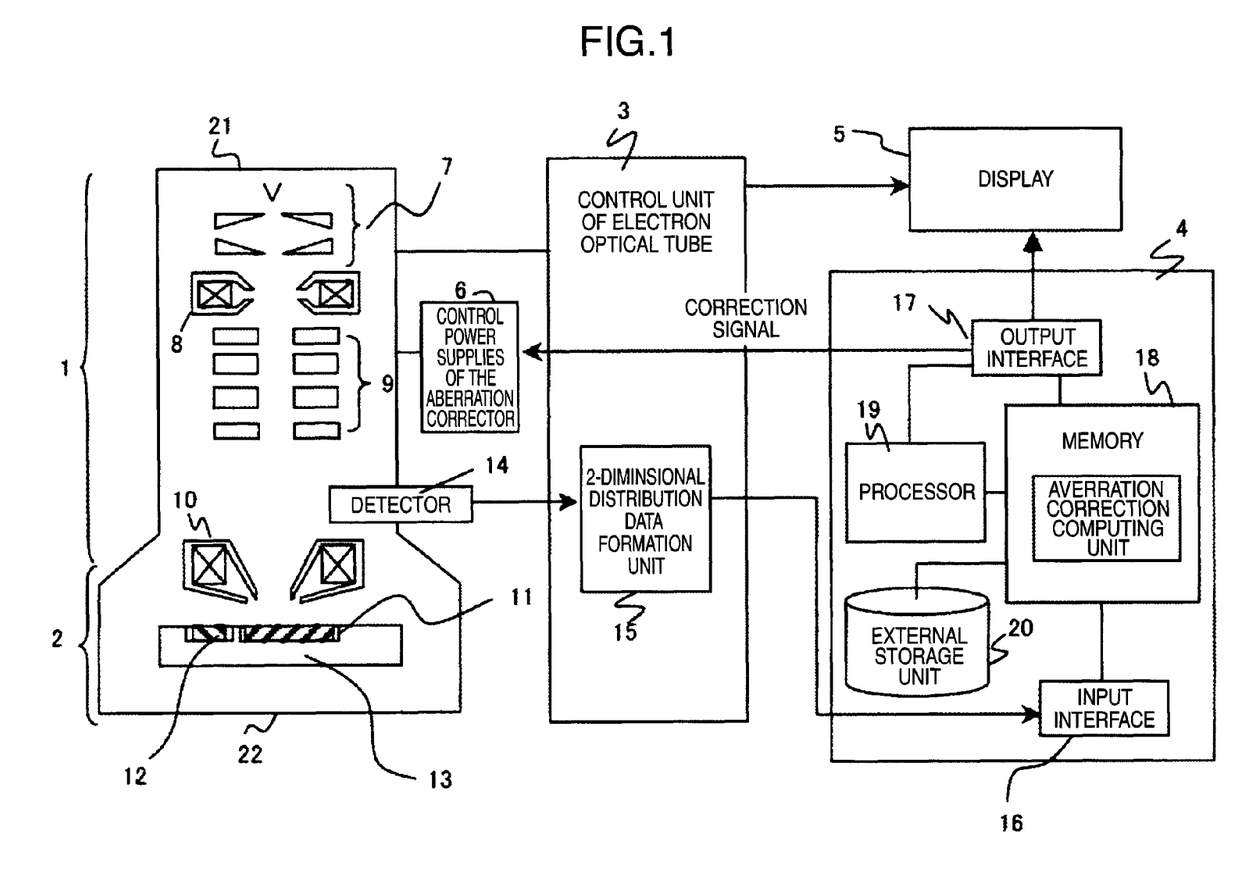
FIG. 1 is a total constitution drawing of an application instrument of an electron beam of embodiment 1.

FIG. 1 shows a schematic drawing of the total constitution of SEM of the present embodiment. A system shown by FIG. 1 is consisted of, in rough classification, an electron optical tube 1 mounted with an aberration corrector, a specimen chamber 2 for storing the specimen, a control unit of electron optical tube 3 for controlling operation voltage or applied current for each of the elements of the electron optical tube 1, an computer 4 for processing output signals from the control unit of electron optical tube 3, a display t 5 for displaying information processed by the computer 4, a control power supplies 6 for driving the aberration corrector, and the like. It should be note that arrow marks in the drawing shows flow of the specimen information.

The electron optical tube 1 is consisted of an electron gun 7, a condenser lens 8 arranged at the lower part of the electron gun 7, an aberration corrector 9, an objective lens 10 placed opposite on the specimen, a secondary electron detector 14 for detecting secondary electrons or reflecting electrons generating by an electron beam irradiated onto the specimen, an vacuum case 21 for storing them and the like. Total constituent elements stored inside the vacuum case 21 may be referred to as an electron optical system. Between the aberration corrector 9 and the objective lens 10, although not shown, a scanning deflector is arranged for scanning a primary charged particle beam. The specimen chamber is provided with a specimen stage 13, which is movable according to a position control signal from the computer 4, a specimen 11 set thereon to be observed, a standard specimen 12 for image adjustment and a vacuum case 22 for storing these.

The charged electron beam emitted from the electron gun 7 produces an image on the specimen 11 by passing through the electron optical system including the aberration corrector 9, and irradiates the specimen 11. The secondary electron emitted from the specimen 11 is output from a SEM side to the computer side, through the detector 14, as a data of brightness distribution type. In the present embodiment, the output signal of the detector 14 is once stored in a memory (not shown) of the control unit 3 of the electron optical tube, and synthesized as the 2-dimensional distribution data of the secondary particles by a 2-dimensional distribution data formation unit 15. The 2-dimensional distribution data formation unit 15 synchronizes output timings of a modulated signal of scanning of the charged particle beam and a signal of the detector 14, and transforms output signal intensity of detector 14 to the 2-dimensional distribution data of the secondary charged particle in a scanning range (in the view field) of the charged particle beam. The synthesized distribution data is transmitted to the computer 4. The distribution data may be directly transmitted to the display 5.

The computer 4 is consisted of an input interface 16 for receiving an output signal from the 2-dimensional distribution data formation unit 15 or the control unit of the electron optical tube 3, a memory 18 and a processor 19 connected to the input interface, an output interface 17 for outputting processing results by the memory 18 or the processor 19, an external storage unit 20 connected to the memory 18 and the like. Arithmetic processing results at the computer 4 are output onto the display 5 or the control power supplies 6 via the output interface 17.

Figure 2:
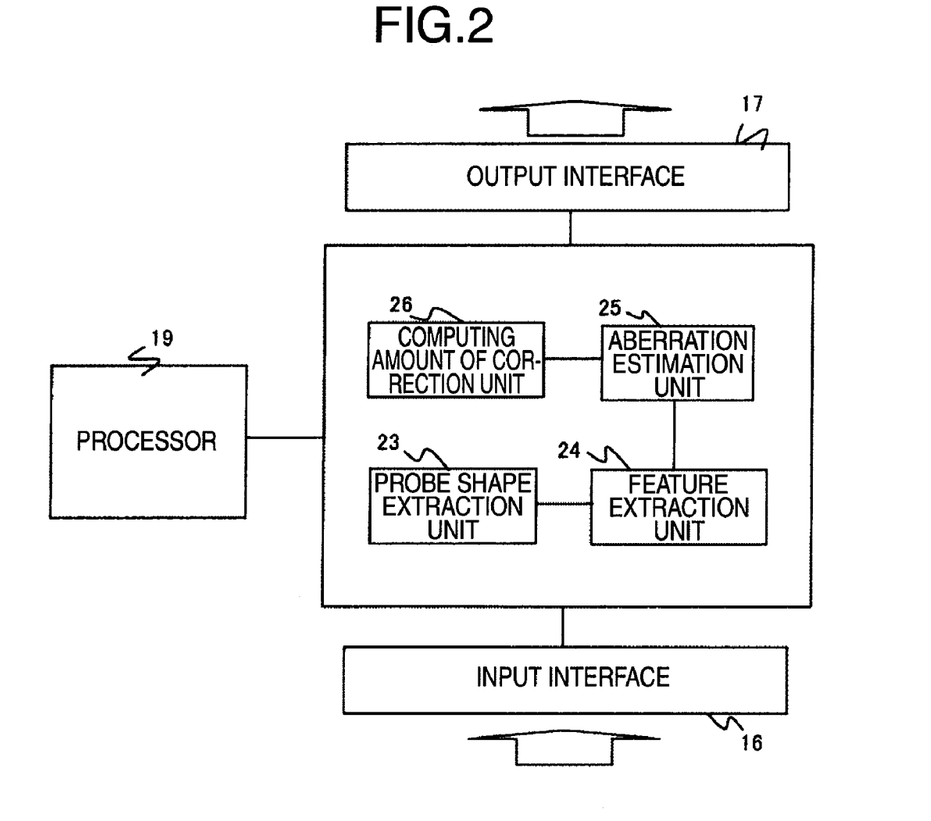
FIG. 2 is a functional block diagram showing processing functions attained by a computer of an application instrument of an electron beam of the present embodiment, in the case where correction operation of an aberration corrector is executed

FIG. 2 is a functional block diagram showing processing functions attained by the computer 4, in the case where correction operation of the aberration corrector 9 is executed. The above-described distribution data, which is input via the input interface 16, is transferred to a probe shape extraction unit 23, and the probe shape of the electron beam probe of a scanning electron microscope is extracted by execution of predetermined arithmetic processing. The probe shape means a contour shape of an irradiation region in the case where the charged particle beam is irradiated onto the specimen, and it is practically expressed by a distribution data of the secondary particle signal corresponding to the contour shape. This data is transferred to a feature extraction unit 24, where arithmetic processing is executed for calculation of a feature parameter of the probe shape. Here, the feature parameter means value representing geometric feature of the probe. The probe shape is considered to reflect kind and size of aberration contained in the optical system at present, and the feature becomes more remarkable in the de-focused state.

Processing results at the feature extraction unit 24 is transferred to an aberration estimation unit 25, where kind and amount of aberration contained in the probe shape, namely, values of aberration coefficients are calculated. The values of the obtained aberration coefficients are output to a computing amount of correction unit 26, where output voltage and current values of the control power supplies 8 (namely applied voltage or excitation current for a multipole lens of the aberration corrector) are calculated, so that each of the values of the aberration coefficients becomes minimal. The calculated voltage value or current value is transmitted to the control power supplies 6 as a correction signal, and is used for control of the aberration corrector 9.

All of the operations explained above are attained by execution of software developed on memory space inside the computer 4, by the processor 19. The software to be developed on the memory 18 is usually stored inside the external storage unit 20.

Figure 3:
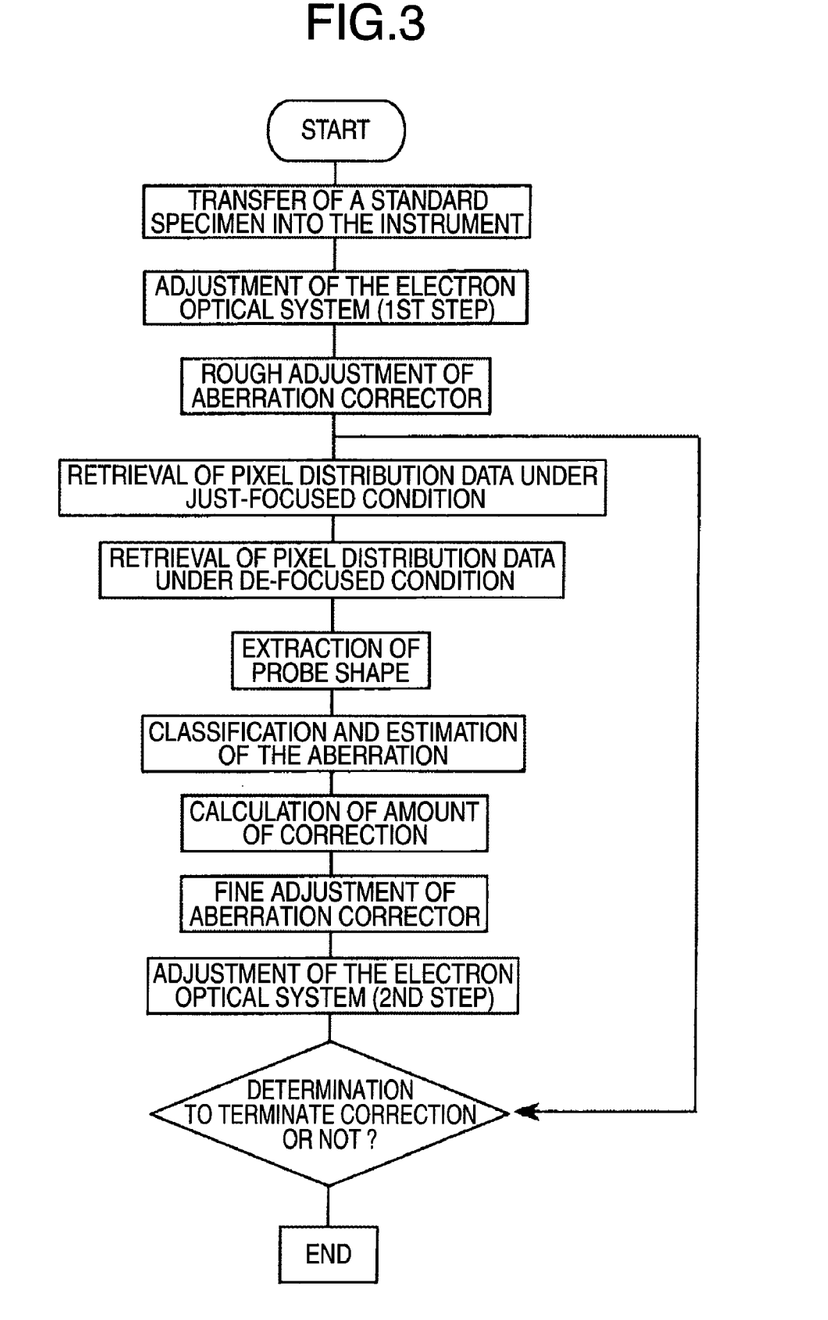
FIG. 3 is a total processing flow in the case where correction operation of an aberration corrector is executed in the application instrument of an electron beam of embodiment 1.

Then, explanation will be given on operation of SEM of the present embodiment. FIG. 3 shows operation flow of SEM of the present embodiment. When an instrument is initiated by start operation, the standard specimen is charged in the instrument, and adjustment of the electron optical system is executed, followed by execution of rough adjustment of the aberration corrector.

Then, focusing is executed by a usual operation in SEM, to acquire a pixel signal data of an electron beam probe in the just-focused state. Shot magnification in acquiring this distribution data is determined to a level in a degree that the probe shape for number of pixels in view field is looked to be a delta function like distribution. For this purpose, it is required to be the magnification condition, where at least probe diameter is a predominant factor of resolution, namely to be the magnification satisfying condition that length of one side of the pixel is smaller than probe diameter. Empirically, the magnification is set so that the pixel number of the probe is equal to or smaller than about 1/20000, relative to total pixel number of the SEM image in a state satisfying the above magnification condition.

Practically, in determination of the size, information on resolution (roughly the same order as the probe diameter) of SEM before adjustment of the aberration corrector, and information on an image size in this resolution are used. For example, in the case where resolution of SEM before adjustment is 3 nm, and an image with a pixel number of 1024×1024 is taken, magnification of a view field is determined so that a region with 3 nm square (or a diameter of 3 nm) corresponds to about several pixels. For example, in the case where area of 3 nm square is consisted by 2*2 pixels, view field size of a total image becomes 1.5 nm*1024 pixels=1500 nm square, and thus a scanning range of an electron beam is determined so that this region is fallen into the view field. Practically, how many pixels consist area of probe shape diameter is determined by trial and error, based on results of trial execution of the correlation function. Information on the obtained probe size and information on the shot magnification are stored in the external memory unit inside the computer 4, and used in adjustment in the next time or later. For the same specimen and SEM, acquiring conditions of the distribution data do not vary so much.

Then, focus is shifted to acquire the distribution data in the de-focused state, under the same conditions as acquiring conditions of a pixel signal data of the electron beam probe in the just-focused state. Amount of focus shift is set in advance, and stored in the memory 18 inside the computer 4, or inside the external storage unit 20. The probe shape in the just-focused state is set in advance so as to be sufficiently larger de-focused amount to be looked a delta function like distribution, as compared with in the de-focused state, and to be large enough for enabling judgment of the probe shape in the de-focused state, for example, the probe diameter in the de-focusing to be in a degree of 80*80 pixels, and an operator determines the size by execution of several times of practical trials and errors of cross-correlations so as to acquire an image with probe shape intensity including information necessary to aberration classification, in further better contrast. In this case also, for the same specimen and SEM, good result can be obtained in a constant de-focus, therefore, the conditions are determined at the initial time.

Here, in acquiring the distribution data of the probe shape in both of the just-focused state and in the de-focused state, it is recommended to use a specimen with a random arrangement of a substance having contrast, and having a size thereof with wide distribution, as the standard specimen. Furthermore, as the standard specimen, it is recommended to select the specimen where a substance with contrast has a sharp edge. For example, such a specimen adhered with gold particles onto a silicon ground or a substrate, by sputtering, is recommended. As the particle material to be adhered, platinum-palladium may also be used. In addition, as the ground or the substrate where the adhesion is executed thereon, carbon, or graphite other than silicon may be used. Still further, the particle may be adhered by vapor deposition, not by sputtering.

The distribution data obtained in the above step is transferred to the computer 4, where the contour shape of the probe is determined by execution of cross-correlation calculation at the probe shape extraction unit 23 of FIG. 2. Then, explanation will be given in detail below on the probe shape extraction step of FIG. 3, with reference to FIG. 4.

Figure 4:
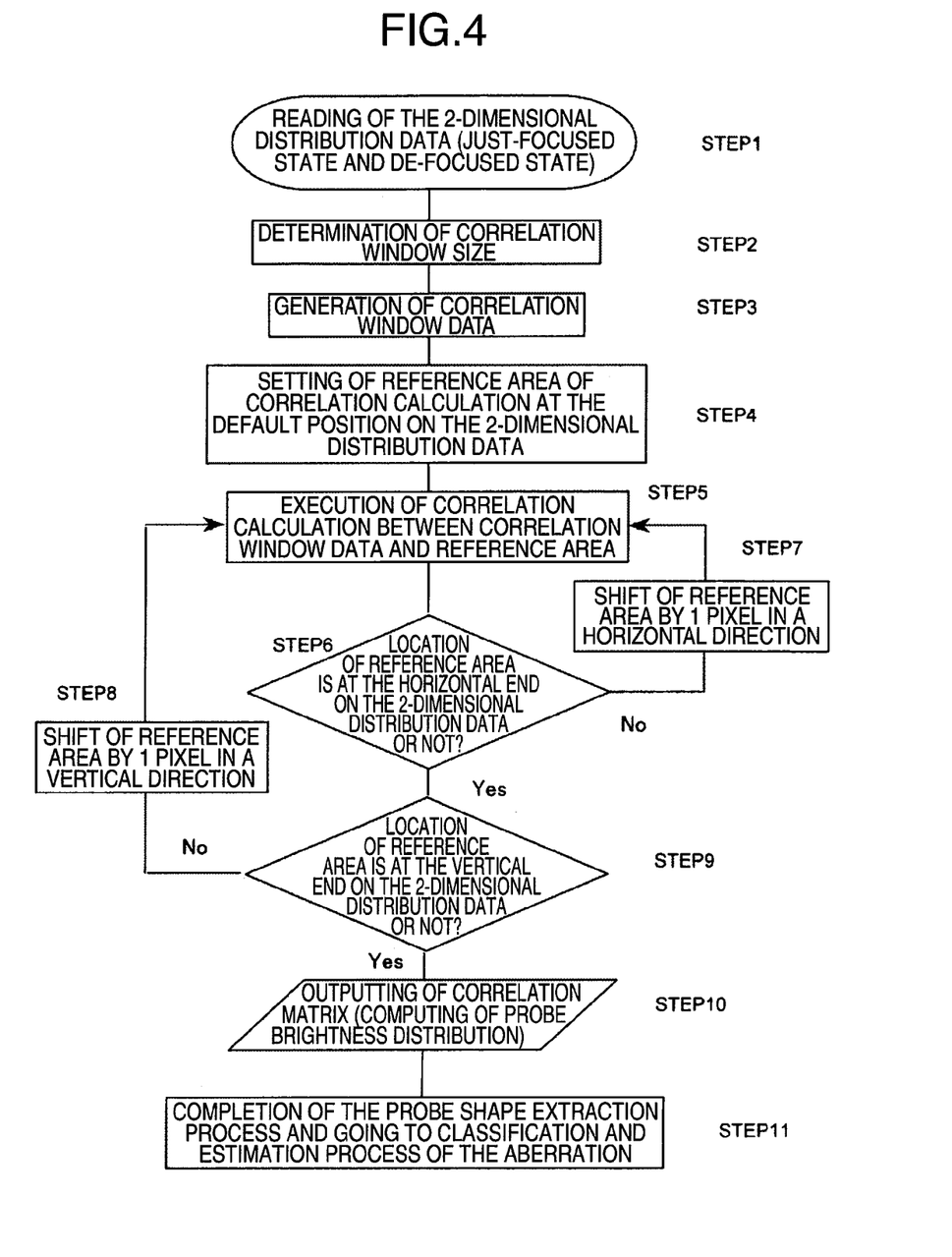
FIG. 4 is a processing flow of probe shape extraction of embodiment 1.

First of all, two sets of the distribution data in the just-focused state and the de-focused state thus obtained are read by the processor as a reference image (a first distribution data) and a correlation window image (a second distribution data) (step 1). Which one of the distribution data in the just-focused state and the de-focused state is set as the reference image and the correlation window image is fundamentally arbitrary, however, it is known empirically that it is better to select the de-focused image as the correlation window image, because of tendency of being less labile to receive effect of image deterioration caused by increased calculation speed (to be described later). Then, a size of the correlation window is determined, based on a size (pixel number) of the reference image and a size of an output image specified by a user (step 2). Once the size is determined, the correlation window is prepared, based on the input correlation window image (step 3). The above procedure is a preprocessing stage for determining cross-correlation in real space.

After completion of the preprocessing, cross-correlation calculation is executed in the real space between the correlation window and the reference image to determine correlation value. This is repeated from a predetermined start position to an end position while shifting a reference position on the reference image. Explanation will be given below on the above-described processing with reference to steps 4 to 11 of FIG. 4.

First of all, a reference area of the correlation calculation is set at a default position on the 2-dimensional distribution data in the just-focused state or the de-focused state (step 4). The default position may be set at an arbitrary position on the 2-dimensional distribution data, however, the left-top position of the distribution (corresponds to an original position in the case where an output signal from the detector 14 is output in time series) is usually set as the default position.

After the default position is set, cross-correlation calculation is executed between the correlation window and the reference area on the reference image to determine a correlation value (step 5). Because the obtained correlation value here has brightness information of the probe, this is set as brightness of a probe shape image at certain one pixel. Then, the reference area on the reference image is shifted by one pixel in a horizontal direction (step 7). Then, correlation calculation of the step 5 is executed for the new reference area and correlation window. This is repeated and when the reference area reaches the end of the reference image (step 6), the reference area is shifted on the reference image by one pixel in a vertical direction (step 8). Then, similarly, correlation calculation of the step 5 is executed for the new reference area and correlation window. The above operation is repeated, and a correlation matrix, which is obtained by scanning the reference image from end to end completely, is output as a brightness distribution matrix of the probe shape (step 10). The obtained brightness distribution of the probe shape is used as input information for aberration classification and aberration estimation (step 11).

Now by returning to FIG. 3 again, the step of "aberration classification and aberration estimation" is executed. The obtained brightness information of the probe shape is transferred to the feature extraction unit 24 attained by the computer 4, to calculate the feature parameters showing characteristics of the probe shape. The obtained feature parameters are transferred to the aberration estimation unit 25, and quantitative estimation of each of the aberration amounts is executed using these feature parameters at the aberration estimation unit 25.

Based on these estimation values, a correction amount of the electron optical system is calculated, and the correction amount is feed backed to the electron optical system (including the aberration corrector) of SEM, as a voltage value of the multipole or a coil current value of the deflector. The process is terminated when the estimating aberration amount reaches equal to or below the predetermined threshold value. Calculation equations or transformation tables for calculating the voltage value of the multipole or the coil current value of the deflector, based on the aberration amount, or the values of the threshold values and the like for judging allowable amount of the aberration are stored inside the computer 4.

It should be noted that, in the present embodiment, speed of the cross-correlation calculation can be increased by providing the second information processing unit exclusive for the cross-correlation calculation, separately from the computer 4 shown in FIG. 1. For example, by processing the process flow, shown in FIG. 3, by a digital signal processor under fixed conditions, calculation normally requiring several seconds by a personal computer can be completed in equal to or shorter than 1 second, and high speed automatic adjustment of the aberration corrector can be realized.

Figure 5:
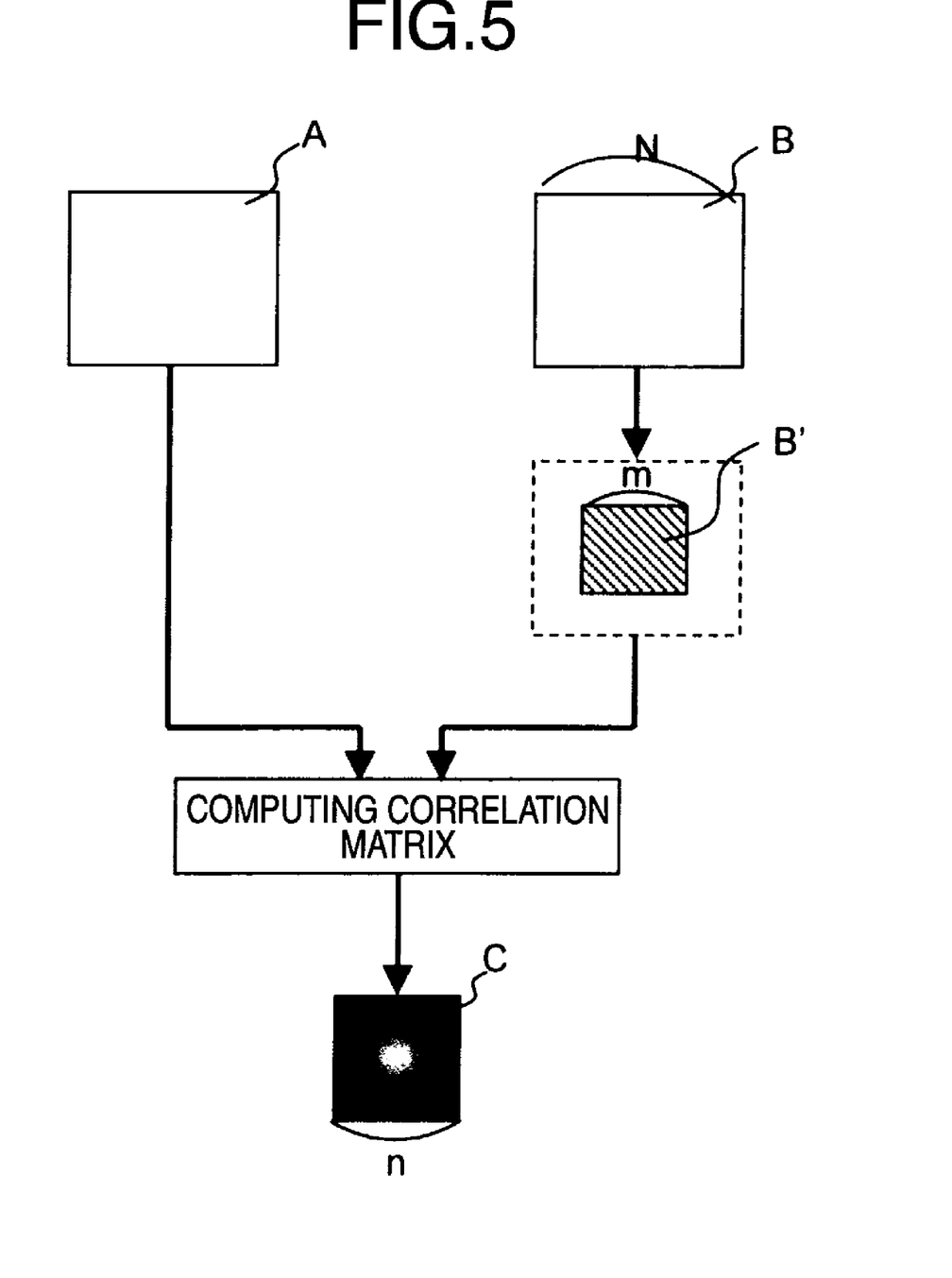
FIG. 5 is an explanation drawing of determination flow of a correlation window.

FIG. 5 is an explanation drawing of determination flow of the correlation window. In FIG. 5, A represents a distribution data of the side used as the reference image, B represents a distribution data of the side to cut out the correlation window, and B' represents a distribution data corresponding to a partial image of B cut out as the correlation window. C represents a resulting image and a distribution data where contour information of the probe shape is included. For simplified explanation, the distribution data to be used assumes to have all square shapes, however, a scanning electron microscope of the present embodiment can be used irrespective of the shape of the distribution data.

First of all, a number of pixels per one size n of the output image C is determined. The size of the output image C is selected by a user of the instrument. Here, it is required that the user of the instrument selects the size n with sufficient allowable space so as to avoid for the obtained too large probe shape size to overflow from the region of the output image C. However, too large size of the output image for the probe shape is not suitable, because there is the following relation among the number of pixels per one size n of the output image C, the number of pixels per one size m of the correlation window image B' to be used in correlation calculation, and the number of pixels per one size N of the image B before cutting out of the correlation window image B':

$$N = N - m + 1 \tag{Equation 7}$$

and thus in the case where the original image size N is constant, increase in n decreases m, resulting in decreased pixel number used in correlation calculation, which lowers calculation accuracy. In the above explanation, explanation was given on the relation among n, N and m, from the view point of the side size of the distribution data (pixel number), however, the situation is the same when viewed by area (total pixel number contained in each of the distribution data) of the distribution data except that the correlation equation changes to n=N−m. Empirically, such a size is selected that pixel number becomes about two times the probe diameter, by using information on the probe diameter in the de-focused state, estimated in advance by a simulation or the like. After the size of the output image is determined, a square region with one side of m is cut out at the vicinity of the center of the de-focused image to provide the correlation window. The center position of the de-focused image can be calculated by using time information of the signal output from the detector 14, and information on scanning signal cycle of the charged particle beam. The above-explained determination algorism of the correlation window and information on the probe diameter in the de-focused image are stored inside the computer 4, and executed by the processor 19 in processing the steps 2 and 3 of FIG. 4.

Figure 6:
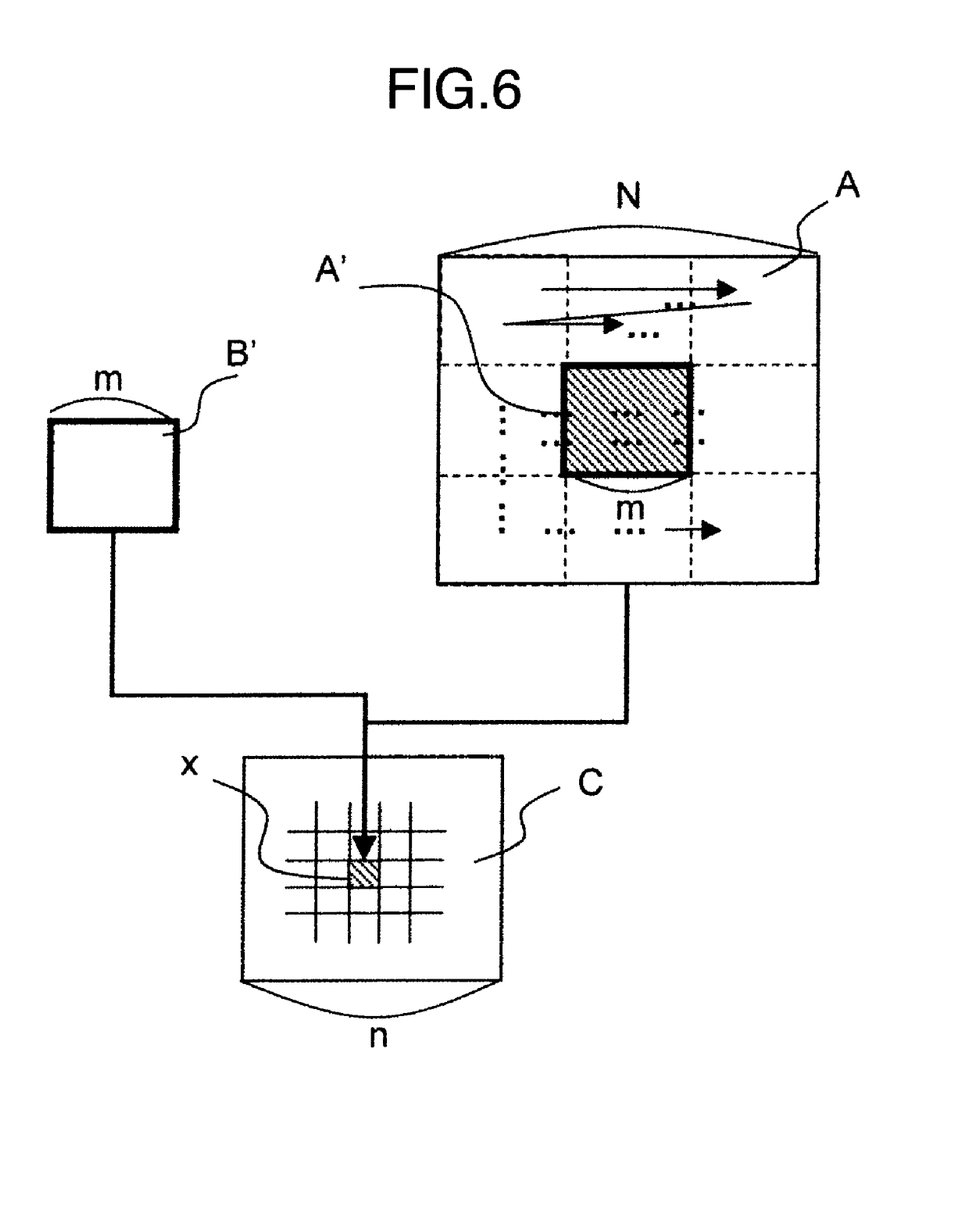
FIG. 6 is a schematic drawing showing progress of cross-correlation calculation.

FIG. 6 is a schematic drawing showing progress of the cross-correlation calculation by the brightness distribution data of the correlation window and the brightness distribution data of the reference image. In FIG. 6, A represents the reference image, B' represents the correlation window image and C represents the output image. In addition, X represents certain one pixel in the output image to be determined now, and A' represents a region corresponding to the pixel X in the reference image A. The region A' is a square region with the same m*m as the correlation window image B', and is a region for shifting in the reference image A corresponding to the position of the pixel to be determined. Hereafter the region A' is referred to as the reference area. In the present embodiment, brightness value of a pixel is determined from left-top to right-bottom direction facing to the image.

For example, to determine a brightness value of a certain pixel X, cross-correlation calculation is executed for a brightness distribution matrix of the reference area A', and a brightness distribution matrix of the correlation window B, and the obtained correlation value is used as the brightness value of the pixel X. The above procedure is one step of the correlation matrix calculation.

To determine brightness value of the next pixel, namely a right neighbor pixel of the pixel X by one pixel, the reference area A' is shifted in a right direction by one pixel in the reference image A to similarly execute cross-correlation calculation. This is repeated and when the right end of the reference area A' reaches the right end of the reference image A, the reference area A' is shifted in a downward direction to the left end of the reference image A by one pixel to execute the cross-correlation calculation with the correlation window B. By repeating the above operation while shifting the reference area A' one pixel by one pixel from the left-top end to the right-bottom end of the reference image A, correlation value with the correlation window B is determined, and the obtained cross-correlation matrix is used as the brightness distribution matrix of the probe shape to be obtained.

In this way, by preparation of the correlation window smaller than the reference image, and execution of the calculation, a calculation area can be made smaller and calculation can be executed faster. In addition, because the corresponding reference area is scanned so as not run off the range of the reference image, the probe shape can be obtained purely from brightness information of the SEM image, without executing data operation such as zero padding or the like. It should be noted that, in the present method, normalized cross-correlation, co-dispersion, residue between the correlation window image and the reference area or the like can be used as values representing cross-correlation.

Figure 7:
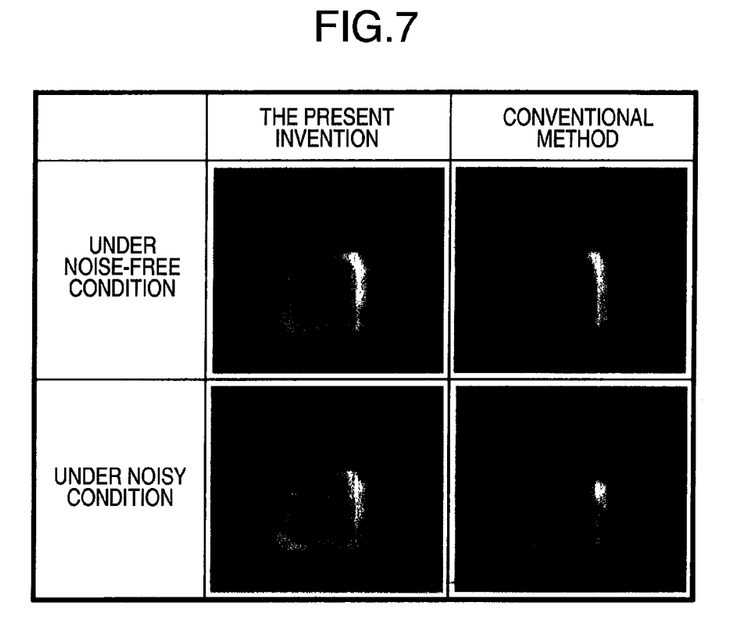
FIG. 7 is a comparative drawing showing difference in probe shapes obtained by the application instrument of an electron beam of embodiment 1 and a conventional instrument.

A method described in the present embodiment has robustness against noises, and is capable of providing a stable image. FIG. 7 shows comparative results of the present embodiment and a conventional method (a deconvolution method), by comparing the cases where the reference image and the correlation window image contain random noises (a) and not contain them (b). Under the condition (a), there is no difference observed in the obtained probe shape and intensity distribution between the present embodiment and the conventional technology, however, under the condition (b), a part of the probe shape is divided into parts and the rim thereof is deformed, caused by the effect of noises, in the conventional technology. In addition, in distribution information of the probe shape obtained by the present embodiment, change is not so much observed as for the probe shape and intensity, between conditions (a) and (b), as compared with the conventional method. Therefore, it has been proved that the probe extraction method of the present embodiment has robustness against noises, as compared with conventional technology.

Figure 8:
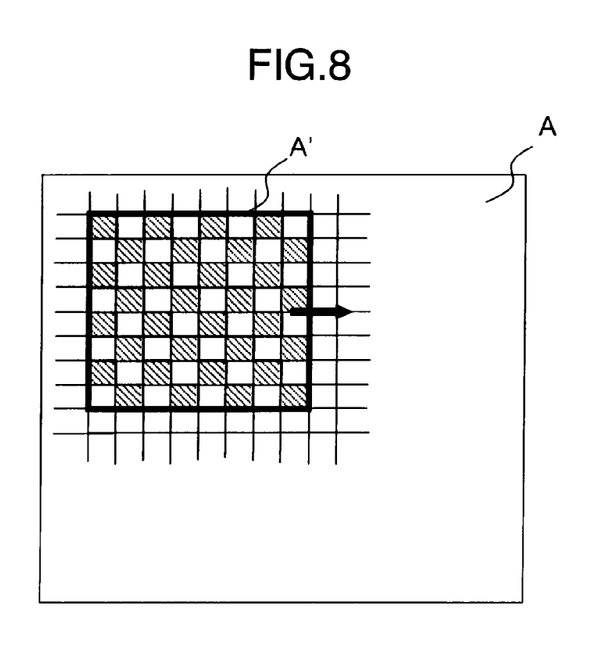
FIG. 8 is a drawing showing one example of a GUI view displayed by the application instrument of an electron beam of the embodiment 1

To increase calculation speed of probe shape extraction explained in FIGS. 3 and 4, calculation is possible by pixel-skipping of the reference area and the correlation window. In FIG. 8, a schematic drawing is shown for explaining pixel-skipping calculation. FIG. 8 shows a calculation target region in calculation by pixel-skipping in every one of the data, and A represents the reference image, A' represents the reference area to be subjected to cross-correlation calculation now, and each one of the square in A' corresponds to each pixel of the image. A meshed square shows the target pixel of the correlation calculation, and the correlation calculation is executed only between this pixel and the corresponding pixel on the correlation window. FIG. 8 is an example of a pixel-skipping rate of 2, which gives pixel number to be a calculation target ½ of the original pixel number.

Calculation time is inversely proportional to the pixel-skipping rate, however, too larger pixel-skipping rate may deteriorate the output image, or lower robustness against noises.

Figure 9:
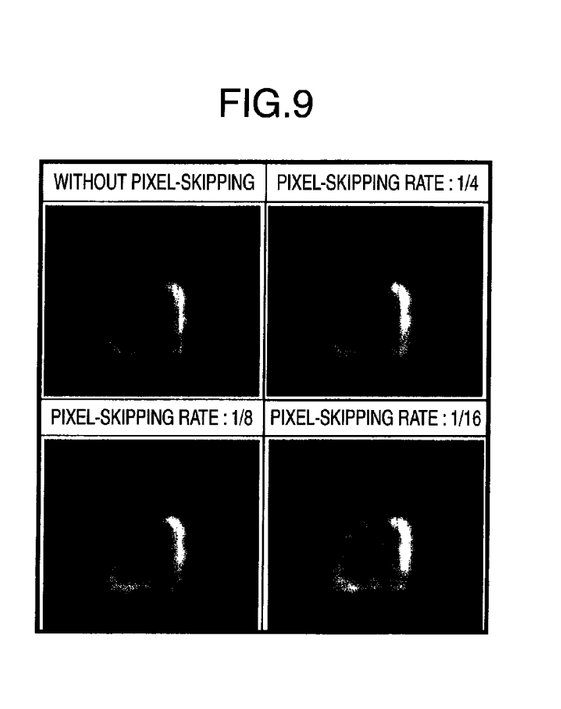
FIG. 9 is a schematic drawing showing pixel-skipping arithmetic processing.

FIG. 9 shows an example of change of a probe shape by pixel-skipping. It is understood that with increase in the pixel-skipping rate, regular noises in an oblique direction generate. Based on experience of the present inventor, the pixel-skipping rate of about 2 to 5 is capable of providing sufficiently fast calculation feeling, and the output image with less image deterioration caused by the pixel-skipping, in the case where the output image of 128*128 is obtained from an image of 512*512. It should be noted that as other method for providing fast calculation of the probe shape extraction, cross-correlation calculation can be executed in frequency space by using high speed Fourier transformation, however, this case is limited only to a square image with a side of $2^n$ pixels.

Figure 10:
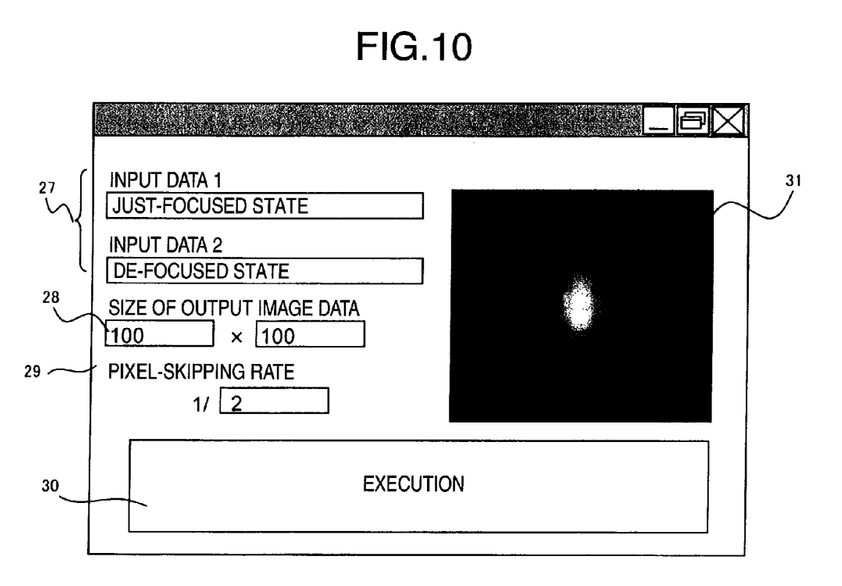
FIG. 10 is a result showing effects of pixel-skipping processing.

FIG. 10 shows a constitution example of a GUI view showing a user interface of a scanning electron microscope of the present embodiment. In the scanning electron microscope of the present embodiment, various calculation results and setting items are provided to a user via GUI, which is output to the display. The GUI view shown in FIG. 10 corresponds to a GUI view shown on the display, in the case where the aberration correction is executed by a manual operation.

A user of the instrument specifies two pieces of the images in the just-focused state and the de-focused state to be used for probe shape extraction at an input image size assignment unit 27. Then, an output image size to be obtained is input to an output image size assignment unit 28, pixel-skipping rate to be executed at a pixel-skipping rate assignment unit 29 for cross-correlation calculation is specified, a start button 30 is pushed to start the calculation. In addition, the user can view the probe shape obtained by the present embodiment, through an output image display unit 31 of the present interface. In the adjustment process of the aberration correction, by displaying this interface by each completion time of the probe shape extraction step of FIG. 3, the user can confirm progress of the adjustment by naked eye, and thus operability is enhanced.

Embodiment 2

In the present embodiment, explanation will be given on an application example of the present invention to an optical microscope such as a confocal microscope or the like. In the case of an optical microscope or a confocal microscope, because aberration cannot be controlled by active control of an optical lens, a high resolution image can be obtained by determination of a point spread function at the just-focused state from a plurality of the de-focused amount, brightness distribution of the probe in the de-focused state, and optical constants (wavelength, NA value, refractive index of a medium and the like) of the microscope, and by execution of deconvolution of the just-focused image.

Explanation was given above on constitution examples of the present invention with reference to embodiment 1 and embodiment 2. Embodiment 1 relates to an example of an application instrument using an electron microscope, and Embodiment 2 relates to an example of an optical microscope, however, the present invention is applicable also to various charged particle beam instruments such as an ion beam instrument and the like.

The present invention can be utilized in a scanning electron microscope, in particular, a scanning electron microscope (SEM), a scanning transmission electron microscope (STEM), an optical microscope, a confocal microscope or the like.

It should be further understood by those skilled in the art that although the foregoing description has been made on embodiments of the invention, the invention is not limited thereto and various changes and modifications may be made without departing from the spirit of the invention and the scope of the appended claims.

The invention claimed is:

1. A charged particle beam instrument provided with a charged particle beam tube to output the secondary particles as secondary particle signals by irradiating an aberration corrected convergent charged particle beam onto a specimen, and detecting secondary particles generated, wherein the instrument comprising:
   a 2-dimensional distribution data formation unit for forming a 2-dimensional distribution data of pixel signals corresponding to said secondary particles, by signal processing of said secondary particle signals; and
   a probe shape extraction unit for calculating brightness distribution of said convergent charged particle beam in a de-focused state, by cross-correlation calculation between said 2-dimensional distribution data in a just-focused state and said 2-dimensional distribution data in a de-focused state.

2. The charged particle beam instrument according to claim 1,
   wherein the instrument comprises an aberration estimation unit for calculating kind and amount of aberration contained in said convergent charged particle beam in said de-focused state, by information processing of information on a calculated probe shape in said de-focused state.

3. The charged particle beam instrument according to claim 2,
   wherein said charged particle beam tube comprises:
   an aberration corrector for correcting said aberration;
   control power supplies for driving said aberration corrector; and
   a computing amount of correction unit for calculating applied voltage or applied current from said control power supplies to said control aberration corrector, by using said calculated kind and amount of aberration.

4. The charged particle beam instrument according to claim 1, wherein, as said 2-dimensional distribution data, a 2-dimensional distribution data of the secondary particles is used, which is detected by using a standard specimen, where particles of any of gold, platinum-palladium are adhered onto a ground of any of silicon, carbon and graphite, by vapor deposition or sputtering.

5. The charged particle beam instrument according to claim 1, wherein, in said cross-correlation calculation, a correlation window is set for said 2-dimensional distribution data, in any of the just-focused state or in the de-focused state.

6. The charged particle beam instrument according to claim 5, wherein the instrument comprising:
   a memory unit for storing pixel number in said brightness distribution in the de-focused state, and information on positions of said pixels, which are obtained for predetermined standard specimen; and
   a size of said correlation window is set, so that all of the pixels contained in said brightness distribution are contained in the result of said cross-correlation calculation.

7. A charged particle beam instrument provided with a charged particle beam tube to output the secondary particles as secondary particle signals by irradiating an aberration corrected convergent charged particle beam onto a specimen, and detecting secondary particles generated, and a computer for acquiring information on irradiation region of said convergent charged particle beam by processing of said secondary particle signals, wherein said computer
   forms a 2-dimensional distribution data of pixel signals corresponding to said secondary particles by signal processing of said secondary particle signals; and further
   executes cross-correlation calculation between said 2-dimensional distribution data in a just-focused state and said 2-dimensional distribution data in the de-focused state to calculate brightness distribution of said convergent charged particle beam in said de-focused state.

8. The charged particle beam instrument according to claim 7,
   wherein said computer executes aberration estimation calculation for calculating kind and amount of aberration contained in said convergent charged particle beam in said de-focused state, by using information on the probe shape in said de-focused state.

9. The charged particle beam instrument according to claim 8,
   wherein said charged particle beam tube comprises an aberration corrector for correcting said aberration, and a control power supplies for driving said aberration corrector; and
   wherein said computer executes arithmetic processing for calculating applied voltage or applied current from said control power supplies to said control aberration corrector, by using said calculated kind and amount of aberration.

10. The charged particle beam instrument according to claim 7, wherein, as said 2-dimensional distribution data, a 2-dimensional distribution data of the secondary particles is used, which is detected by using a standard specimen, where particles of any of gold, platinum-palladium are adhered onto a ground of any of silicon, carbon and graphite, by vapor deposition or sputtering.

11. The charged particle beam instrument according to claim 7, wherein, in said cross-correlation calculation, a correlation window is set for said 2-dimensional distribution data in any of the just-focused state or in the de-focused state.

12. The charged particle beam instrument according to claim 11, wherein the instrument comprising:
  a memory unit for storing pixel number in said brightness distribution in the de-focused state, and information on positions of said pixels, which are obtained for predetermined standard specimen; and
  a size of said correlation window is set, so that all of the pixels contained in said brightness distribution are contained in the result of said cross-correlation calculation.

* * * * *